(12) United States Patent
Zhang

(10) Patent No.: US 6,330,182 B1
(45) Date of Patent: Dec. 11, 2001

(54) METHOD FOR EVALUATING SOFT ERROR IMMUNITY OF CMOS CIRCUITS

(75) Inventor: Kevin X. Zhang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/159,466

(22) Filed: Sep. 23, 1998

(51) Int. Cl.$^7$ .................................................. G11C 11/00
(52) U.S. Cl. ........................ 365/154; 326/121; 714/703
(58) Field of Search ................................ 714/703, 704; 257/376, 511, 302; 438/449, 282; 326/121; 365/154; 327/537

(56) References Cited

U.S. PATENT DOCUMENTS

| | | | | |
|---|---|---|---|---|
| 4,506,436 | * | 3/1985 | Bakeman, Jr. et al. | 438/449 |
| 5,018,102 | | 5/1991 | Houston | 365/95 |
| 5,048,023 | | 9/1991 | Buehler et al. | 714/773 |
| 5,053,848 | | 10/1991 | Houston et al. | 257/537 |
| 5,065,048 | | 11/1991 | Asai et al. . | |
| 5,095,355 | * | 3/1992 | Shiomi et al. | 257/511 |
| 5,208,657 | * | 5/1993 | Chatterjee et al. | 257/302 |
| 5,220,192 | | 6/1993 | Owens et al. | 257/519 |
| 5,301,146 | | 4/1994 | Hama . | |
| 5,311,070 | * | 5/1994 | Dooley | 327/208 |
| 5,338,963 | * | 8/1994 | Klaasen et al. | 257/376 |
| 5,363,328 | | 11/1994 | Browning, III et al. | 365/154 |
| 5,365,478 | | 11/1994 | Shimohigashi et al. . | |
| 5,377,140 | | 12/1994 | Usuki | 365/154 |
| 5,384,731 | | 1/1995 | Kuriyama et al. | 365/154 |
| 5,432,463 | | 7/1995 | Wong et al. | 326/32 |
| 5,434,818 | | 7/1995 | Byers et al. | 365/189 |
| 5,465,060 | | 11/1995 | Pelella | 327/51 |
| 5,473,562 | | 12/1995 | Liu | 365/154 |
| 5,473,574 | | 12/1995 | Clemen et al. | 365/230 |
| 5,541,528 | | 7/1996 | Montoye et al. | 326/34 |
| 5,547,888 | | 8/1996 | Yamazaki | 438/279 |
| 5,576,644 | | 11/1996 | Pelella | 327/51 |
| 5,631,863 | | 5/1997 | Fechner et al. | 365/156 |
| 5,661,411 | | 8/1997 | Nguyen | 326/21 |
| 5,677,866 | | 10/1997 | Kinoshita | 365/156 |
| 5,691,089 | | 11/1997 | Smayling . | |
| 5,706,237 | | 1/1998 | Ciraula et al. | 365/222 |
| 5,732,037 | | 3/1998 | Shimohigashi et al. . | |
| 5,764,564 | | 6/1998 | Frake et al. | 365/154 |
| 5,828,597 | | 10/1998 | Madan | 365/156 |
| 5,973,541 | | 10/1999 | Rajivan et al. | 327/374 |
| 6,057,184 | * | 5/2000 | Brown et al. | 438/282 |

OTHER PUBLICATIONS

Matsukawa et al. (Evaluation of Soft–Error Hardness of DRAMS under Quasi–Heavy Ion Irradiation Using He Single Ion Microprobe Technique; IEEE, Dec. 1996).*

* cited by examiner

Primary Examiner—Albert Decady
Assistant Examiner—Emeka J. Amanze
(74) Attorney, Agent, or Firm—Blakely, Sokoloff, Taylor & Zafman LLP

(57) ABSTRACT

A method for evaluating the robustness of a logic circuit to soft errors involves injecting a current pulse into a node of the logic circuit. The current pulse is shaped to be representative of a high-energy particle strike, and may have an amplitude that is sufficient to momentarily discharge an output node of the logic circuit. The output node of the logic circuit is electrically monitored to determine whether a transition occurs from a first logic state to a second logic state in response to the injected current pulse. In the case where the state of the output node does flip in response to the injected current pulse, a waveform of the injected current pulse is integrated over time to compute a critical charge level ($Q_{CRIT}$). Where the amplitude is insufficient to cause the output node to flip, the amplitude of the injected current pulse is incremented and the above steps are repeated using the incremented amplitude until a logic state transition does occur at the output node.

15 Claims, 2 Drawing Sheets

METHOD FOR EVALUATING SOFT ERROR IMMUNITY OF CMOS CIRCUITS

RELATED APPLICATIONS

This application is related to co-pending applications: Ser. No. 09/159,463, filed Sep. 23, 1998, entitled, "Improved Soft Error Immunity in CMOS Circuits With Large Shared Diffusion Areas"; Ser. No. 09/159,465, filed Sep. 23, 1998, entitled, "A CMOS Latch Design With Soft Error Immunity"; and Ser. No. 09/159,464, filed Sep. 23, 1998, entitled, "A CMOS Register File With Soft Error Immunity"; all of which are assigned to the assignee of the present application.

FIELD OF THE INVENTION

The present invention relates generally to the field of integrated circuits; more specifically, to methods and apparatus for protecting chip circuitry against the harmful effects of natural background radiation.

BACKGROUND OF THE INVENTION

Recently there has been concerted effort among researchers and engineers to protect integrated chip circuitry from the troubling effect of natural background radiation. Natural background radiation, in the form of energetic alpha particles and neutrons, has become an increasingly difficult problem to solve as transistor size shrinks with each new generation of chips. High-energy particle irradiation can corrupt data stored in memory chips, producing what engineers refer to as "soft errors". As the semiconductor industry progresses toward line widths as fine as 0.18 microns, soft errors in data pose a major challenge.

A number of different approaches have been tried to reduce soft error rates in semiconductor devices. By way of example, U.S. Pat. No. 5,691,089 discloses a transistor device in which a doped layer of a radiation sensitive material is formed a substrate. The radiation sensitive material may be polyamide or a similar organic dielectric. The inventors attribute improved alpha particle immunity to the complete isolation of the SRAM array by the organic dielectric layer.

A semiconductor memory array that reduces the probability of soft errors ascribable to alpha particles is also described in U.S. Pat. Nos. 5,365,478 and 5,732,037. These patents disclose a circuit solution applied to a dynamic random-access memory (DRAM). Another example is provided in U.S. Pat. No. 5,065,048, which teaches specialized precharging operations that enlarge the soft error margin against alpha particle strikes in CMOS and BiCMOS logic circuits. Yet another approach to the problem of soft errors in semiconductor memory devices is described in U.S. Pat. No. 5,301,146.

In order to deal effectively with the problem of soft errors, it is necessary to have a reliable method to predict soft error rates (SER) for various circuits at the physical design level. One commonly used method is to examine the total quantity of charge stored at a given circuit node. This previous method is typically based on experimental data from static random-access memories (SRAM), such as that shown in FIG. 1.

FIG. 1 illustrates a simple memory cell 10 comprising field-effect devices 11–14 arranged as cross-coupled inverters. In its basic operation, memory cell 10 produces a signal at an output node 17 that represents an inverted logic signal of the input applied at node 16. Note that in FIG. 1, capacitor $C_{TOT}$ represents the total node capacitance at node 17 of memory cell 10. In addition, arrow 18 represents a high-energy particle, such as an alpha or neutron particle. If an alpha particle 18 passes the diffusion layer of the drain of an N-type field-effect device (e.g., field-effect device 14) when output node 17 is at a high logic level, electrons generated by the alpha particle strike are collected at the same drain. Thus, the generation of electron-hole pairs by high-energy particles has a tendency to discharge various nodes throughout a logic circuit.

In the past, researchers have been primarily concerned about soft errors in memory circuits, due to their relatively small circuit size. Soft error immunity has been calculated in such circuits by using the total node charge ($Q_{NODE}$) and the overall circuit area, or memory cell diffusion area. This latter parameter is related to the total capacitance at the output node of the memory cell. Generally speaking, the larger the diffusion area, the more charge that the output node can store.

Although methods such as that described above have proven satisfactory for memory array designs, they have failed to reliably predict soft error rates in other types of circuits such as latches and register files. Given that soft errors in these latter circuits have become a major source of overall chip failure rate as circuits continue to shrink, it is critical to establish a unified method to accurately predict soft error rates for all types of logic circuits.

As will be seen, the present invention provides a methodology that is useful in predicting soft error rates for a variety of circuits and/or processes. Moreover, the invention reflects the scaling impact of process technology, and also reveals principles for designing soft error robustness into logic circuits of any type.

SUMMARY OF THE INVENTION

A method is provided which combines the physical nature of a soft error event with the electrical properties of circuit topology. In accordance with one embodiment of the present invention, the robustness of a logic circuit to the soft errors is evaluated by first injecting a current pulse into a node of the logic circuit. The current pulse is shaped to be representative of a high-energy particle strike. For example, the amplitude may be sufficient to momentarily discharge an output node of the logic circuit. The output node of the logic circuit is then monitored for a response to the injected current pulse. Basically, the output node is electrically monitored to determine whether it transitions from a first logic state to a second logic state in response to the injected current pulse.

In the case where the state flips in response to the injected current pulse, a waveform of the injected current pulse is integrated over time to compute a critical charge level ($Q_{CRIT}$). By determining the critical charge level for each of several different types of logic circuits on an integrated circuit, and plotting the failure rate of each of the different types of logic circuits versus critical charge level, a unified methodology for evaluating soft error immunity is achieved.

DESCRIPTION OF THE DRAWINGS

The present invention is illustrated by way of example, and not by way of limitation, in the figures of the accompanying drawings, where.

DETAILED DESCRIPTION

Throughout the following description specific details are set forth in order to provide a more thorough understanding of the invention. However, the invention may be practiced without these particulars. In other instances, well known elements have not been shown or described in detail to avoid unnecessarily obscuring the present invention. Accordingly, the specification and drawings are to be regarded in an illustrative, rather than a restrictive, sense.

Figure 1:
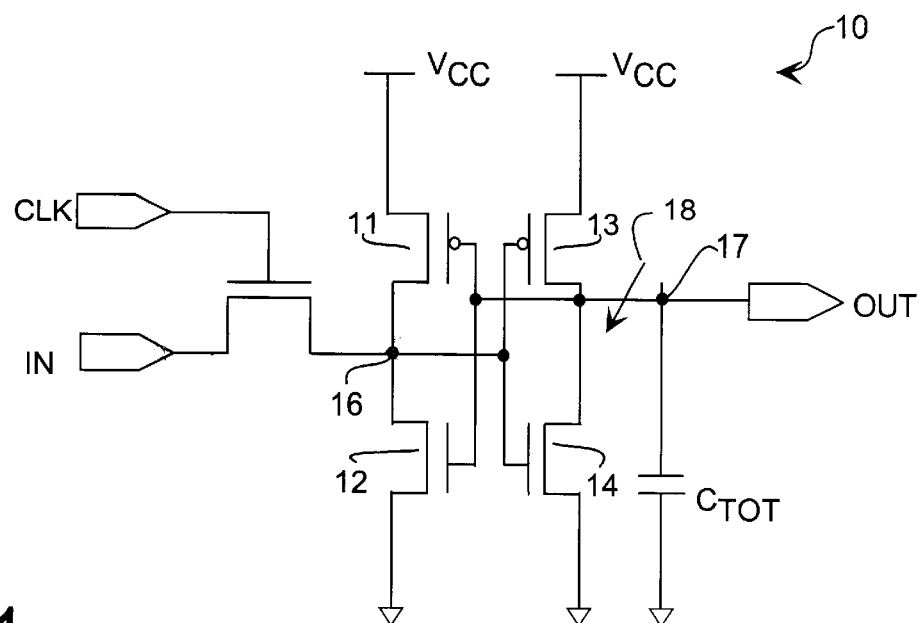
FIG. 1 is a prior art memory cell subjected to an energetic particle.
Figure 2:
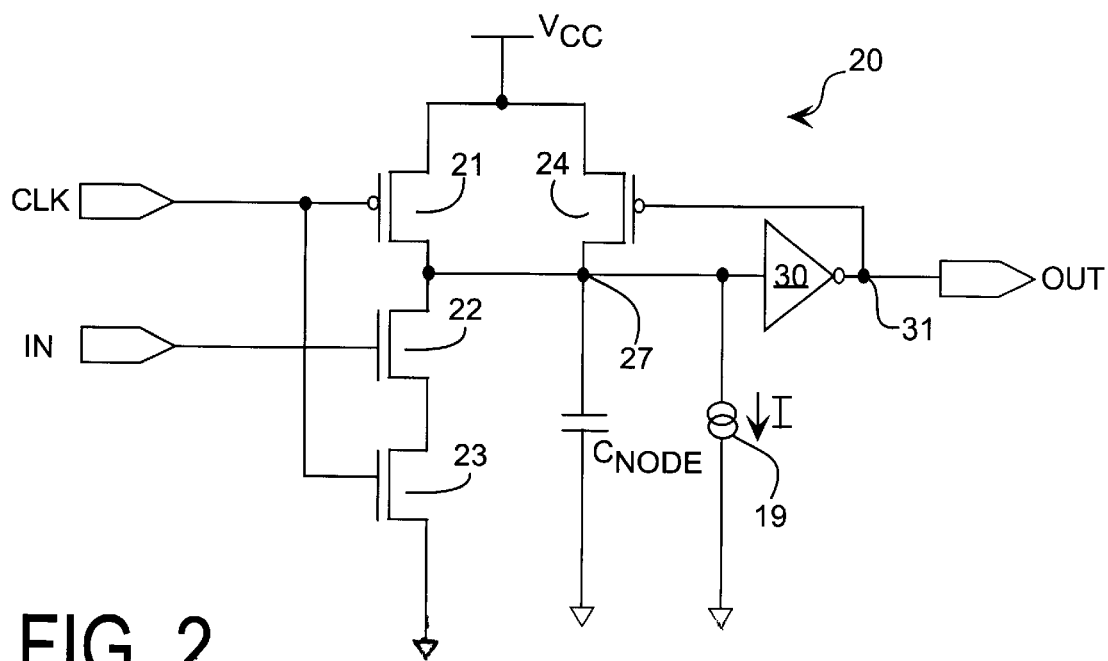
FIG. 2 is a circuit schematic diagram that illustrates one embodiment of the method of the present invention.

With reference to FIG. 2, there is shown a general logic circuit 20 comprising field-effect devices 21–24. Devices 21 and 24 are p-type field-effect transistors (PFETs), whereas transistors 22 and 23 are n-type field-effect transistors (NFETs). Both transistors 21 and 23 have their gate coupled to a input clock signal, with the gate of transistor 22 being coupled to receive input data. As can be seen, transistors 21 and 22 are arranged such that when the input clock signal is high, the output logic level at node 27 represents an inverted state with respect to the input signal applied to the gate of NFET 22.

Also shown in logic device 20 of FIG. 2 is an inverter 30 having an input coupled to node 27 and an output node 31, which is coupled to the gate of PFET transistor 24. A capacitance, $C_{NODE}$, represents the total parasitic capacitance at node 27. A current source 19 is coupled to node 27 according to the method of the present invention, as will be described in more detail below. Practitioners familiar with logic circuit designs will recognize that generalized logic circuit 20 functions to latch data provided at the input. Logic circuit 20 may find a wide application in a variety of different integrated circuits.

In accordance with one embodiment of the present invention, current source 19 is employed at the circuit level to inject a current pulse into storage node 27. This current pulse is intended to be equivalent to an energetic particle—such as an alpha particle or neutron particle—impacting the silicon substrate. As is well known, high-energy particles of this type generate electron-hole pairs, which are collected by the storage node. It is the collection of these additional carriers at the storage node of a semiconductor device that causes a soft errors.

To evaluate the immunity of storage node 27 to a particle strike, the circuit may be simulated under strike conditions. In the CMOS circuit shown in FIG. 2 a current pulse is injected into storage node 27, and the response of the node is electrically monitored and recorded. Output node 31 is also monitored to determine when the logic state at the output flips, i.e., from a logical zero ("0") to a logical one ("1").

Note that the exact shape of the current pulse may be determined by specific strike conditions. Due to the statistical nature of soft error events, a representative shape can be obtained through device/process simulation, thereby giving an average result. Furthermore, the amplitude of the current pulse should be generally sufficient to at least momentarily discharge node 27. By incrementally increasing the amplitude of the current pulse the minimum amplitude required to cause the output logic state to flip can be determined. In other words, the amplitude of the current pulse is gradually increased until a point is reached at which the logic state at output node 31 flips from a "0" to a "1". At that particular current amplitude, a critical charge level may be computed.

Figure 3:
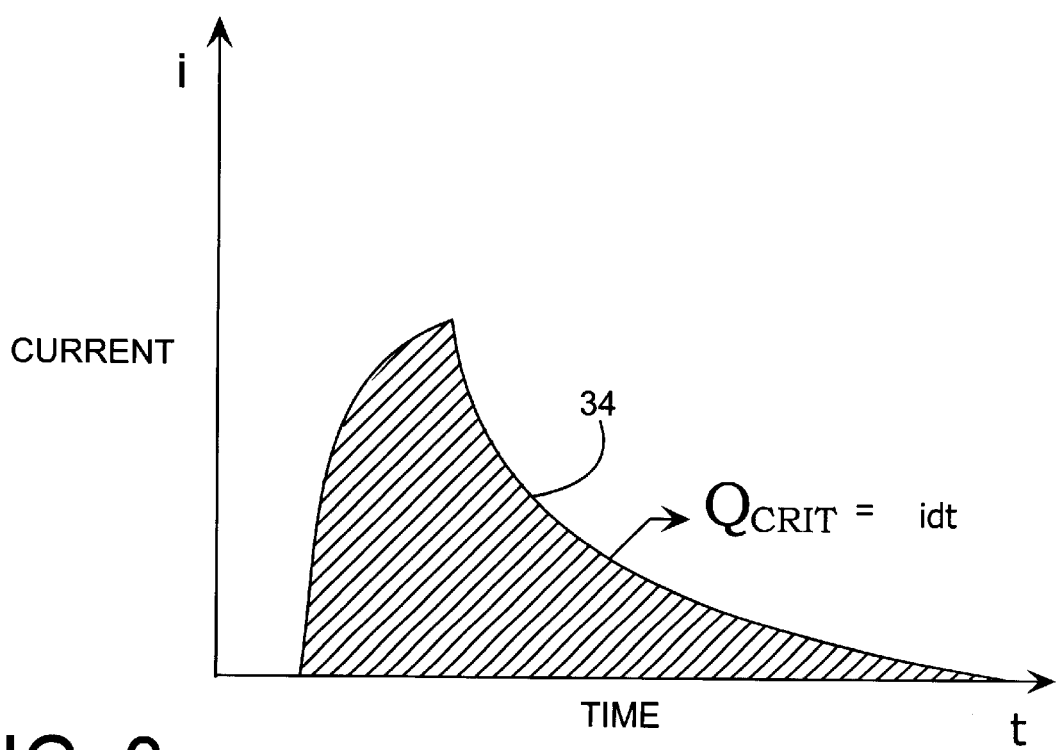
FIG. 3 is a current waveform used in accordance with one embodiment of the present invention.

The total amount of charge injected into node 27 sufficient to cause the output node to change states is referred to as the critical charge level ($Q_{CRIT}$). This critical charge is computed by integrating a waveform of the injected current pulse over time. An example waveform 34 is illustrated in FIG. 3. It is appreciated that the integration of the current pulse over time represents the shaded area under curve 34 shown. In accordance with the present invention, the critical charge, $Q_{CRIT}$, is used to measure the logic circuit's immunity to soft errors. Large $Q_{CRIT}$ values indicate better circuit immunity. This means that $Q_{CRIT}$ represents a key parameter for evaluating the robustness of a particular logic circuit. The dependency of soft error rates on $Q_{CRIT}$ may be established from experimental data.

Figure 4:
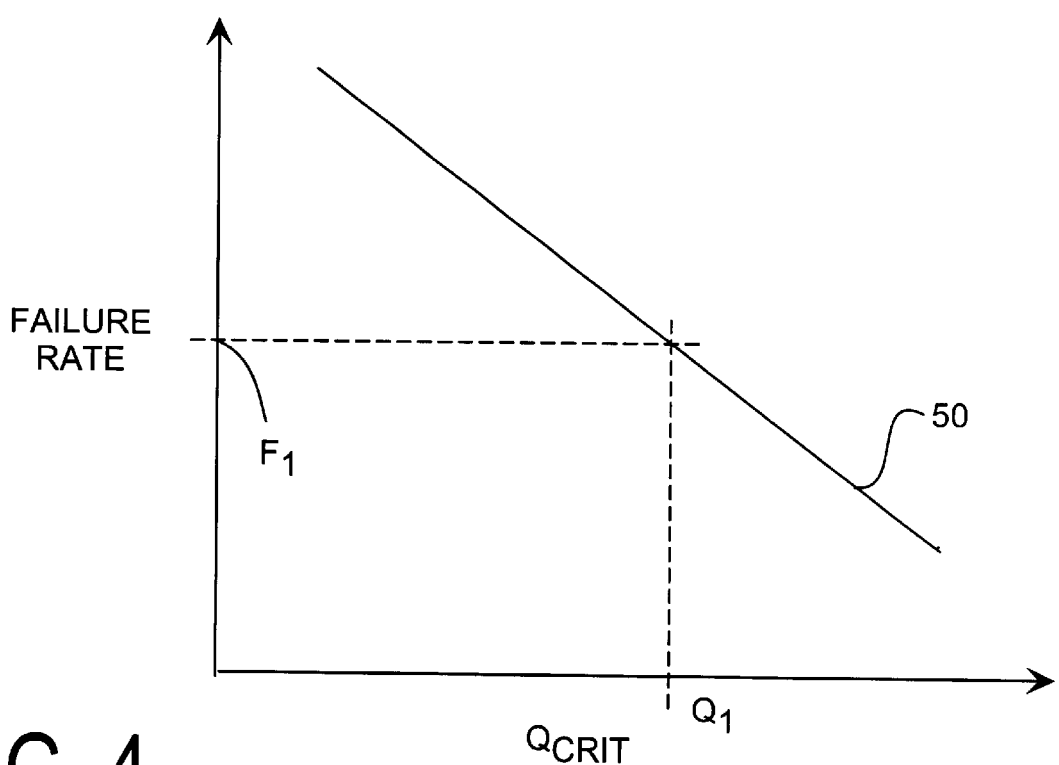
FIG. 4 is a plot of soft error failure rate versus critical charge for different types of logic devices.

It should be understood that while $Q_{CRIT}$ is related to the earlier parameter $Q_{NODE}$ (representing the total amount of charge stored at a node), it is also directly related to the detailed circuit topology, including device sizes and logic switching points at a given node. This means that the parameter $Q_{CRIT}$ can be used to reveal a fundamental principle on how to improve soft error rates in different types of logic circuits fabricated on the same silicon substrate. For instance, this is realized experimentally by relating $Q_{CRIT}$ versus the failure rate of different types of logic devices on an integrated circuit. This methodology is illustrated in the graph of FIG. 4.

An interesting aspect of the present invention is that the parameter $Q_{CRIT}$ provides a way to unify evaluation of different types of logic circuits. For example, curve 50 of FIG. 4 represents a plot of $Q_{CRIT}$ versus failure rate for several different types of logic circuits. Note that all of the different types of logic circuits produce a single curve 50. In past approaches, plots of $Q_{NODE}$ versus failure rate for each type of circuit resulted in a different curve for each different type of logic circuit. By providing an evaluation method that yields a unified relationship between failure rate and critical charge, the method of the present invention permits specifying $Q_{CRIT}$ as a process parameter. Thus, the present invention permits a circuit designer or engineer a methodology for optimizing circuit topologies in order to maximize $Q_{CRIT}$.

For example, a failure rate criterion, $F_1$, can be established for a particular product or process. Once experimental data has been gathered to produce curve 50 (relating the failure rate to $Q_{CRIT}$) a base line level of critical charge, $Q_1$, may then be specified as a process parameter. This allows circuit designers and process engineers to modify the design of an integrated circuit to achieve a critical charge level that meets the specified parametric limits. By way of example, the invention permits the scaling of soft error rates for different circuits and process technologies by simple modification of the node diffusion area (the diffusion area of a storage node is where the electrons or holes are actually collected during a particle strike). Since the ratio of the diffusion area to total circuit area varies widely from circuit-to-circuit, or from process-to-process, modifying diffusion area is one way to achieve low soft error failure rates.

I claim:

1. A method for evaluating robustness of a logic circuit to soft errors caused by a particle strike comprising:

injecting a current pulse representative of the particle strike into a node of the logic circuit, the current pulse having an amplitude;

monitoring an output node of the logic circuit for response to the current pulse to determine whether the output node transitions from a first logic state to a second logic state; if so, integrating, over time, a waveform of the current pulse to compute a critical charge; otherwise incrementing the amplitude of the current pulse until the output node transitions from a first logic state to a second logic state.

2. The method according to claim 1 further comprising:

simulating the particle strike to determine a representative shape of the current pulse.

3. The method according to claim 1 wherein the amplitude is sufficiently large so as to at least momentarily discharge the output node of the logic circuit.

4. The method according to claim 1 wherein the node of the logic circuit comprises the output node.

5. The method according to claim 1 wherein the node comprises an internal node of the logic circuit.

6. The method according to claim 1 wherein the waveform comprises a plot of current versus time.

7. The method according to claim 1 wherein the logic circuit is a first type of logic circuit fabricated on an integrated circuit (IC), and further comprising:

performing the method of claim 1 for different types of logic circuits on the IC;

relating the critical charge of each of the different types of logic circuits, including the first type of logic circuit, to a failure rate corresponding to each of the types of logic circuits.

8. The method according to claim 7 further comprising:

setting a failure rate criteria for the IC; and modifying the IC to insure the critical charge is sufficiently large such that the IC passes the failure rate criteria.

9. A method for evaluating robustness of an integrated circuit (IC) to soft errors caused by a particle strike comprising the steps of:

(a) injecting a current pulse representative of the particle strike into a node of a logic circuit on the IC, the current pulse having an amplitude that is sufficiently large so as to at least momentarily discharge an output node of the logic circuit;

(b) monitoring the output node of the logic circuit for response to the current pulse to determine whether the output node transitions from a first logic state to a second logic state; if so, (i) integrating, over time, a waveform of the current pulse to compute a critical charge; otherwise (ii) incrementing the amplitude of the current pulse; and (iii) repeating steps (a)–(b) using the incremented amplitude until the output node transitions from a first logic state to a second logic state.

10. The method according to claim 9 further comprising the initial step of:

simulating the particle strike to determine a representative shape of the current pulse.

11. The method according to claim 9 wherein the node of the logic circuit comprises the output node.

12. The method according to claim 9 wherein the node comprises an internal node of the logic circuit.

13. The method according to claim 9 wherein the waveform comprises a plot of current versus time.

14. The method according to claim 9 wherein the logic circuit is a first type of logic circuit fabricated on the IC, and further comprising the steps of:

repeating steps (a)–(b) for different types of logic circuits on the IC;

relating the critical charge of each of the different types of logic circuits, including the first type of logic circuit, to a failure rate corresponding to each of the types of logic circuits.

15. The method according to claim 14 further comprising the step of:

setting a failure rate criteria for the IC; and modifying the IC to insure the critical charge is sufficiently large such that the IC passes the failure rate criteria.

* * * * *

UNITED STATES PATENT AND TRADEMARK OFFICE
CERTIFICATE OF CORRECTION

PATENT NO. : 6,330,182 B1
DATED : December 11, 2001
INVENTOR(S) : Zhang

It is certified that error appears in the above-identified patent and that said Letters Patent is hereby corrected as shown below:

Column 1,
Line 37, delete "formed a substrate" and insert -- formed over a substrate --.

Signed and Sealed this

Twenty-fifth Day of June, 2002

*Attest:*

*Attesting Officer*

JAMES E. ROGAN
*Director of the United States Patent and Trademark Office*